(12) United States Patent
Peters et al.

(10) Patent No.: US 10,073,352 B2
(45) Date of Patent: Sep. 11, 2018

(54) AQUEOUS SOLUTION AND PROCESS FOR REMOVING SUBSTANCES FROM SUBSTRATES

(71) Applicant: Versum Materials US, LLC, Tempe, AZ (US)

(72) Inventors: Richard Dalton Peters, Westfield, IN (US); Travis W. Acra, Ingalls, IN (US); Kimberly Dona Pollard, Pendleton, IN (US)

(73) Assignee: VERSUM MATERIALS US, LLC, Tempe, AZ (US)

( * ) Notice: Subject to any disclaimer, the term of this patent is extended or adjusted under 35 U.S.C. 154(b) by 0 days.

(21) Appl. No.: 15/096,362

(22) Filed: Apr. 12, 2016

(65) Prior Publication Data

US 2017/0293228 A1    Oct. 12, 2017

(51) Int. Cl.
*C11D 7/50* (2006.01)
*G03F 7/42* (2006.01)

(52) U.S. Cl.
CPC .................. *G03F 7/425* (2013.01)

(58) Field of Classification Search
CPC ............................................... C11D 11/0047
USPC ........................................................ 510/175
See application file for complete search history.

(56) References Cited

U.S. PATENT DOCUMENTS

| 5,489,557 | A | 2/1996 | Jolley |
| 8,183,162 | B2 | 5/2012 | Chang |
| 9,291,910 | B2 | 3/2016 | Peters et al. |
| 2005/0263743 | A1* | 12/2005 | Lee ............... C11D 7/3218 252/364 |
| 2009/0082240 | A1 | 3/2009 | Nukui et al. |
| 2009/0241988 | A1 | 10/2009 | Ramachandrarao et al. |
| 2013/0200040 | A1 | 8/2013 | Fitzsimmons et al. |
| 2015/0094249 | A1* | 4/2015 | Peters ............... G03F 7/425 510/176 |

FOREIGN PATENT DOCUMENTS

| EP | 1 211 563 A1 | 6/2002 |
| JP | 2008166404 A | 7/2008 |
| JP | 2011208227 A | 10/2011 |
| WO | WO 02/33033 A1 | 4/2002 |
| WO | WO 2005/085957 A1 | 9/2005 |

OTHER PUBLICATIONS

Notification of Transmittal of the International Search Report and the Written Opinion of the International Searching Authority dated Feb. 3, 2015 for International Application No. PCT/US2014/055191.

* cited by examiner

*Primary Examiner* — Gregory Webb
(74) *Attorney, Agent, or Firm* — Anne B. Kiernan

(57) ABSTRACT

The disclosure is directed solutions and processes to remove substances from substrates. In some cases, the substances can include photoresist on semiconductor wafers. The solution can include a quaternary ammonium hydroxide an amine, and optionally a corrosion inhibitor and/or a sugar alcohol. One or more sides of the substrate can be contacted with the solution to remove one or more substances from the substrate.

14 Claims, 1 Drawing Sheet

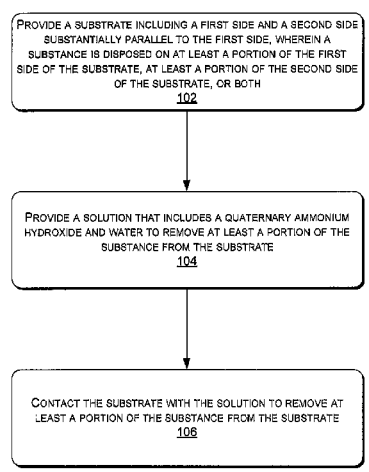

100

PROVIDE A SUBSTRATE INCLUDING A FIRST SIDE AND A SECOND SIDE SUBSTANTIALLY PARALLEL TO THE FIRST SIDE, WHEREIN A SUBSTANCE IS DISPOSED ON AT LEAST A PORTION OF THE FIRST SIDE OF THE SUBSTRATE, AT LEAST A PORTION OF THE SECOND SIDE OF THE SUBSTRATE, OR BOTH
102

PROVIDE A SOLUTION THAT INCLUDES A QUATERNARY AMMONIUM HYDROXIDE AND WATER TO REMOVE AT LEAST A PORTION OF THE SUBSTANCE FROM THE SUBSTRATE
104

CONTACT THE SUBSTRATE WITH THE SOLUTION TO REMOVE AT LEAST A PORTION OF THE SUBSTANCE FROM THE SUBSTRATE
106

AQUEOUS SOLUTION AND PROCESS FOR REMOVING SUBSTANCES FROM SUBSTRATES

BACKGROUND

Various substances, such as polymers, may be used in the manufacture of electronic devices, such as computer chips, memory devices, light emitting diodes (LEDs), and the like. In some cases, these substances may be used to form features on surfaces of substrates (e.g., semiconductor device substrates) included in electronic devices. In processing the substrates, these substances may be removed from the surfaces of the substrates. In one example, a layer of a substance may be disposed on at least a portion of the surface of a substrate and at least a portion of the layer may be removed during subsequent processing of the substrates. In another example, the substance may be a residue produced when a particular process is performed on the substrate. In any case, the effectiveness of the removal of the substances from the substrates can affect the quality of the operation of the semiconductor devices.

In an illustrative situation, photoresists and organic-based dielectrics may be used in the manufacture of semiconductor devices included in electronic devices. Photoresists, for example, may be used throughout semiconductor device fabrication in photolithographic operations. A photoresist may be exposed to actinic radiation through a photomask. For example, a polymeric photoresist can be applied to a substrate as a mask to define the placement of solder onto the substrate. After solder is deposited onto the substrate, the photoresist must be removed before the next step in the process can occur. In another example, a polymeric photoresist can be applied to a substrate as an etch mask used to define structures on the substrate that are created in an etch process. After the etch process, there is typically a polymeric residue remaining on the substrate that must be removed before the next step in the process can occur.

In some cases, a positive photoresist may be used. Exposure of the positive photoresist to actinic radiation may cause a chemical reaction resulting in a solubility increase in aqueous alkali that allows the positive photoresist to be dissolved and rinsed away with developer. In other cases, a negative photoresist may be used. When the negative photoresist is exposed to actinic radiation, cross-linking of the polymer may occur in the exposed regions while leaving unexposed regions unchanged. The unexposed regions may be subject to dissolution and rinsing by a suitable developer chemistry. Following development, a resist mask may be left behind. The design and geometry of the resist mask may depend upon the positive or negative tone of the resist. Positive tone resist may match the design of the photomask, while a negative tone resist may provide a pattern that is opposite the photomask design.

Photoresists are used extensively in the packaging of microelectronic devices. In wafer level packaging, solder is applied directly to wafers that have completed the fabrication of the microelectronic devices but have not been diced into individual chips. A photoresist is used as the mask to define the placement of the solder on the wafers. After solder is deposited onto the wafer, the photoresist must be removed before the next step in the packaging process can occur. Typically in wafer level packaging, the photoresist can have a thickness greater than about 10 micrometers and sometimes as thick as about 120 micrometers. The photoresist can be positive or negative, and can be applied either as a liquid or a dry film. In wafer level packaging, the use of thick dry film negative photoresist is common.

Due to the thickness and cross-linked nature of thick dry film negative photoresist, the removal of this material after solder deposition can be difficult. In some cases, the photoresist can be deposited onto a dielectric material where the adhesion between the photoresist and the dielectric is strong enough to make removal of the photoresist difficult.

Some substances, such as hydrogen peroxide solutions, can remove photoresist material, but they can be corrosive to dispensing equipment. Additionally, the fast decomposition of hydrogen peroxide in some formulations to form water and oxygen gas byproducts, results in a solution requiring a defoaming additive to be practical for a manufacturing set up. A need exists for compositions that will remove photoresist materials from a substrate, and that are not substantially corrosive to dispensing equipment and that can be handled with greater ease than compositions with significant foaming characteristics.

SUMMARY

The disclosure is directed to solutions and processes to remove photoresist materials from semiconductor wafer substrates. In particular, the photoresist can include a dry film acrylate-based photoresist that is on a semiconductor wafer that includes one or more solder bumps. The solder bumps can be formed from a Sn-based solder. Additionally, the substrate can include exposed dielectric material in addition to exposed Cu and/or Al.

The solution can include a quaternary ammonium hydroxide, an amine, a corrosion inhibitor and water. Further, the solution can include a sugar alcohol.

The solution can include the quaternary ammonium hydroxide in an amount no greater than about 8% by weight of the total weight of the solution. Additionally, the solution can include the amine in an amount no greater than about 10% by weight of the total weight of the solution and the sugar alcohol in an amount no greater than about 15% by weight of the total weight of the solution. The amine can include one or more tertiary amines, alkanol amines and/or aliphatic amines.

One or more sides of the substrate can be contacted with the solution to remove one or more substances from the substrate. For example, one or more sides of the substrate can be contacted with the solution to remove photoresist or organic residue from the photoresist patterning process from the one or more sides of the substrate. The substrate can be contacted with the solution at temperature of about 15° C. to about 99° C., for a duration of at least about 5 minutes, and alternatively from about 5 minutes to about 180 minutes. If desired, fresh amounts of the solution can be provided to contact the substrate at one or more intervals during the process to replenish the activity of the stripping solution, known as a bleed-and-feed process.

BRIEF DESCRIPTION OF THE DRAWINGS

FIG. 1 is a flow diagram of a process to remove substances from substrates.

DETAILED DESCRIPTION

This disclosure describes aqueous solutions and processes to remove substances from substrates. When the substance is in contact with the solution, the substance may be released from a surface of the substrate. One or more sides of the substrate can be contacted by the solution. If desired, one or more substrates can be immersed in the solution. In other situations, the solution can be dispensed onto at least one surface of one or more substrates to remove at least one substance from the substrate. For example, the solution can be sprayed onto one or more surfaces of the substrate to remove at least one substance from the one or more surfaces of the substrate.

Processes described herein may be utilized to remove substances from substrates, such as microelectronic wafers, flat panel displays, LEDs, and so forth. The techniques described herein can be used to remove photoresist and/or organic residue from the photoresist patterning process, herein referred to collectively as photoresist, from electronic device substrates. The photoresist may be removed in conjunction with wafer level packaging, (WLP) operations. Furthermore, by using solutions and processes described herein, the efficient removal of targeted substances from substrates can be accomplished with minimal impact to other substances on the substrates. For example, in the removal of photoresist from a substrate, any corrosion of copper, aluminum, or solder included on the substrate can be minimized or eliminated.

The term "coating" is defined as a method for applying a film to a substrate such as spray coating, puddle coating, or slit coating. The term "release" or "releasing" relates to removal of the substance from the substrate and is defined to include dissolution of the substance. The indefinite articles "a" and "an" are intended to include both the singular and the plural. All ranges are inclusive and combinable in any order except where it is clear that such numerical ranges are constrained to add up to 100%, and each range includes all the integers within the range. The terms "weight percent" or "wt %" mean weight percent based on the total weight of the composition, unless otherwise indicated.

FIG. 1 is a flow diagram of an example process 100 to remove substances from substrates. At 102, the process 100 includes providing a substrate including a first side and a second side substantially parallel to the first side. The substrate may include an inorganic substrate, such as a silicon-containing substrate or a substrate comprising alloys of materials selected from Group III and Group V of the Periodic Table of the Elements. For example, the substrate can include silicon, silicon dioxide, gallium arsenide, (GaAs), or indium gallium arsenide (InGaAs). The silicon-containing substrate can be doped with one or more materials, such as B, Ga, As, P, or combinations thereof. The substrate can also include one or more metals. Additionally, the substrate can include organic materials, such as one or more polymeric materials. For example, the substrate can include a polyimide. Further, the substrate can include one or more layers, such as one or more core layers, one or more reinforcing layers, one or more insulating layers, one or more metal layers, or a combination thereof. In addition, features of circuit patterns, bonding articles (e.g. solder balls), combinations thereof, and the like, can be disposed on one or more sides of the substrate.

Surfaces of the substrate can be circular in shape. Alternatively, surfaces of the substrate can be quadralateral in shape, such as rectangular or square-shaped. Additionally, the substrate can have one or more dimensions defining a surface area of the substrate, such as radius, diameter, length, width, or combinations thereof. The substrate can also have a thickness. The thickness of the substrate can include the thickness of one or more layers of the substrate. The thickness of the substrate can be in a range of about 250 micrometers to about 950 micrometers, in a range of about 500 micrometers to about 800 micrometers, or in a range of about 700 micrometers to about 780 micrometers. Additionally, the width or the diameter of the substrate can be in a range of about 50 mm to about 450 mm, in a range of about 200 mm to about 300 mm, or in a range of about 200 mm to about 450 mm.

The substrate may be thinner. For example, substrates can be thinned to enable stacking of devices into one single package. The thickness of thin substrates can be in a range of 20 micrometers to 100 micrometers, or in a range from 25 micrometers to 75 micrometers. The thin substrate can be supported on a carrier and attached to the carrier by an adhesive. The carrier and the adhesive are temporary supports from which the thin substrate can be removed. During processing of the thin substrate while attached to the carrier, the thickness of the carrier and thin substrate combination can be included in a range of about 700 mm to about 900 mm.

A substance can be disposed on the substrate. The substance can be disposed on one side of the substrate. For example, the substance can be disposed as a layer covering substantially all of a particular side of the substrate. In another example, the substance can be disposed on portions of the particular side of the substrate, while other portions of the particular side of the substrate are free from the substance. The substance can be disposed on the particular side of the substrate according to a pattern. Additionally, the substance can be disposed on multiple sides of the substrate.

Furthermore, the thickness of the substance disposed on the substrate can be substantially uniform. Alternatively, the thickness of the substance disposed on the substrate varies. The thickness of the substance disposed on the substrate may be no greater than about 300 micrometers, no greater than about 240 micrometers, or no greater than about 120 micrometers. In addition, the thickness of the substance on the substrate can be at least about 5 micrometers, at least about 25 micrometers, at least about 40 micrometers, or at least about 60 micrometers. In an illustrative example, the thickness of the substance on the substrate may be included in a range of about 8 micrometers to about 125 micrometers. In another illustrative example, the thickness of the substance on the substrate may be included in a range of about 20 micrometers to about 80 micrometers.

Photoresist may be disposed on a side of the substrate. The photoresist can be a negative photoresist. Alternatively, the photoresist may be a positive photoresist. The photoresist layer can be comprised of two separately deposited layers. The photoresist disposed on a side of the substrate may have been exposed to actinic radiation, such as ultraviolet light. Additionally, the one or more photoresist layers may have been subjected to one or more additional processes before the solution is applied to the one or more surfaces of the substrate. The photoresist can include an acrylate polymer. For example, the photoresist can be a thick dry film acrylate-based photoresist.

At 104, the process 100 includes providing a solution to remove one or more substances from the substrate. The solution can dissolve a targeted substance (e.g., photoresist) that is disposed on the substrate and/or cause the targeted substance to be released from the substrate.

The substrate can be immersed in the solution. For example, the substrate can be immersed in a bath of the solution. The solution can also be applied to one or more sides of the substrate. For example, one or more sides of the substrate can be coated with the solution. To illustrate, one or more sides of the substrate can be sprayed with the solution. Additionally, the solution can be spin coated onto one or more sides of the substrate. When multiple sides of the substrate are contacted with the solution, the solution can be applied to each side in a sequential manner. That is, the solution can be applied to a side of the substrate for a specified period of time and under suitable conditions, and then the solution can be applied to an additional side of the substrate. Alternatively, the solution can be applied to multiple sides of the substrate substantially contemporaneously.

The solution can be an aqueous solution that includes a quaternary ammonium hydroxide, an amine, a corrosion inhibitor and water. Further, the solution can include a sugar alcohol.

For example, the solution can include quaternary ammonium hydroxides such as tetraethylammonium hydroxide (TEAH), tetramethylammonium hydroxide (TMAH), dimethyldipropylammonium hydroxide (DMDPAH), or ethyltrimethylammonium hydroxide (ETMAH) or combinations thereof.

The solution can include no greater than about 8% by weight of the quaternary ammonium hydroxide for a total weight of the solution, or no greater than about 7% by weight of the quaternary ammonium hydroxide for a total weight of the solution, or no greater than about 6% by weight of the quaternary ammonium hydroxide for a total weight of the solution, or no greater than about 5% by weight of the quaternary ammonium hydroxide, for a total weight of the solution. In addition, the solution can include at least about 1% by weight of the quaternary ammonium hydroxide for a total weight of the solution, or at least about 2% by weight of the quaternary ammonium hydroxide for a total weight of the solution, or at least about 3% by weight of the quaternary ammonium hydroxide for a total weight of the solution, or at least about 4% by weight of the quaternary ammonium hydroxide for a total weight of the solution or at least 5% by weight of the quaternary ammonium hydroxide for a total weight of the solution. Further, the solution can include an amount of the quaternary ammonium hydroxide included in a range of about 1% by weight to about 8% by weight for a total weight of the solution or an amount of the quaternary ammonium hydroxide included in a range of about 2% by weight to about 6% by weight for a total weight of the solution.

The solution can also include an amine or an alkanolamine. For example, the amine can include 1,8-diazabicyclo[5.4.0]undec-7-ene, tetraethylenepentamine, monoethanolamine, diethanolamine or triethanolamine and mixtures thereof.

The solution can include no greater than about 10% by weight of the amine for a total weight of the solution, no greater than about 9% by weight of the amine for a total weight of the solution, no greater than about 8% by weight of the amine for a total weight of the solution, no greater than about 7% by weight of the amine for a total weight of the solution, no greater than about 6% by weight of the amine for a total weight of the solution, no greater than about 5% by weight of the amine for a total weight of the solution, and no greater than about 4% by weight of the amine for a total weight of the solution. Additionally, the solution can include at least about 0.8% by weight of the amine for a total weight of the solution, at least about 2% by weight of the amine for a total weight of the solution, or at least about 3% by weight of the amine for a total weight of the solution. The solution can also include an amount of the amine included in a range of about 1% by weight to about 10% by weight for a total weight of the solution. Furthermore, the solution can include an amount of the amine included in a range of about 2% by weight to about 6% by weight for a total weight of the solution.

The solution can also include one or more sugar alcohols. Sugar alcohols can include alcohols having the formula $HOCH_2(CHOH)_nCH_2OH$ where n=1-22. For example, the sugar alcohol, can include glycerin, sorbitol or xylitol. Further the solution can include an amount of sugar alcohol included in a range of about 0.1% by weight to about 15% by weight of the total weight of the solution.

The solution can also include a corrosion inhibitor. The corrosion inhibitor can minimize or eliminate corrosion of one or more metals on the substrate, such as copper, aluminum or solder. In particular, the corrosion inhibitor can include one or more of dodecanedioic acid, sebacic acid, undecanedioic acid and $C_4$-$C_{14}$ dibasic acids or the amine salts thereof. For example the corrosion inhibitor can include Corfree® M1 dibasic acid mixtures or amine salt mixtures from INVISTA of Charlotte, N.C. In addition, the solution can include no greater than about 9% by weight of the corrosion inhibitor for a total weight of the solution, no greater than about 7% by weight of the corrosion inhibitor for a total weight of the solution, and no greater than about 5% by weight of the corrosion inhibitor for a total weight of the solution. Furthermore, the solution can include at least about 0.1% by weight of the corrosion inhibitor for a total weight of the solution, at least about 1% by weight of the corrosion inhibitor for a total weight of the solution, or at least about 3% by weight of the corrosion inhibitor for a total weight of the solution. The solution can include an amount of the corrosion inhibitor included in a range of about 0.1% by weight to about 8% by weight for a total weight of the solution. The solution can also include an amount of the corrosion inhibitor included in a range of about 0.5% by weight to about 4% by weight for a total weight of the solution.

An amount of water included in the solution can be no greater than about 95% by weight for a total weight of the solution, no greater than about 90% by weight for a total weight of the solution, no greater than about 85% by weight for a total weight of the solution or no greater than about 80% by weight for a total weight of the solution, no greater than about 75% by weight for a total weight of the solution, or no greater than about 70% by weight for a total weight of the solution. Additionally, the solution can include an amount of water included in a range of about 70% by weight to about 95% by weight for a total weight of the solution. Further, the solution can include an amount of water included in a range of about 80% by weight to about 95% by weight for a total weight of the solution.

As shown in FIG. 1 at 106, the process 100 includes contacting the substrate with a solution such that one or more sides of the substrate are contacted by the solution. The substrate can be contacted with the solution to remove at least a portion of one or more substances from the substrate. The solution can dissolve a targeted substance (e.g., photoresist) that is disposed on the substrate and/or cause the targeted substance to be released from the substrate. In particular, the solution can remove at least about 75% of the targeted substance from the substrate, at least about 85% of the targeted substance from the substrate, at least about 95% of the targeted substance from the substrate, or at least about 99% of the targeted substance from the substrate. Additionally, the solution can remove substantially all of the substance from the substrate. The solution can include a formulation described previously herein.

The substrate can be immersed in the solution. For example, the substrate can be immersed in a bath of the solution. Alternatively, the solution can be applied to one or more sides of the substrate. To illustrate, the solution can be dispensed onto one or more sides of the substrate. The solution can also be coated onto one or more sides of the substrate. The solution can be agitated while the substrate is contacted with the solution.

Contacting the substance on the substrate with the solution can also include heating the solution, the substrate, or both to a temperature that provides for the removal of the substance within a specified period of time. The solution, the substrate, or both can be heated to a temperature no greater than about 99° C., no greater than about 90° C., no greater than about 80° C., or no greater than about 70° C. Additionally, the substrate, or both can be heated to a temperature of at least about 15° C., at least about 30° C., at least about 40° C., at least about 50° C., at least about 60° C., at least about 70° C. or at least about 80° C. Furthermore, the solution, the substrate, or both can be heated to a temperature included in a range of about 25° C. to about 99° C. The solution, the substrate, or both can also be heated to a temperature included in a range of about 45° C. to about 95° C. or about 60° C. to about 85° C.

An amount of heat to increase a temperature of the solution and/or substrate can be provided by a heat source, such as a conductive heat source or a convective heat source.

The substrate can be contacted with the solution for a specified duration that is no greater than about 120 minutes, no greater than about 105 minutes, no greater than about 90 minutes, or no greater than about 75 minutes. Additionally, the substrate can be contacted with the solution for a specified duration that is at least about 10 minutes, at least about 25 minutes, at least about 40 minutes, or at least about 60 minutes. Further, the substrate can be contacted with the solution for a duration included in a range of about 10 minutes to about 120 minutes. The substrate can also be contacted with the solution for a duration included in a range of about 15 minutes to about 60 minutes.

The substrate can be contacted with an initial amount of the solution, and then contacted with additional amounts of the solution at suitable time intervals using a bleed-and-feed type of process.

The composition of the solution can change over time with use and additional amounts of the solution can be added to the current solution to maintain the amount of one or more components of the current solution within a specified range. Furthermore, at some point, a current amount of the solution can be replaced with a fresh amount of the solution after a period of time. This process can be referred to as a bleed and feed operation. Additionally, a current amount of the solution can be replaced with a fresh amount of the solution when the current amount of the solution is unable to remove an amount of one or more substances from the substrate after the substrate has been contacted with the current amount of the solution for a specified period of time. In addition, in operations where water evaporates from the solution thereby concentrating the remaining components, additional water may be added to maintain the desired weight percentages of the solution components.

After being contacted with the solution for a period of time, the substrate can then be rinsed and dried. For example, the substrate can be subjected to one or more rinse operations using deionized water. Examples of typical rinsing agents include deionized water and/or low boiling point solvents such as acetone and isopropyl alcohol (IPA). The substrate can be rinsed using multiple operations, such as an IPA rinse followed by a deionized water rinse. Alternatively, the substrate can be rinsed in water followed by an IPA rinse. The substrate can be subjected to one or more drying operations, such as drying using a stream of one or more of air, nitrogen, or argon.

The solution can include a quaternary ammonium hydroxide, an amine or alkanolamine, optionally a sugar alcohol, optionally a defoamer, at least one corrosion inhibitor, and water. In the examples below, various stripping compositions were used in a one step process to remove a negative patterned thick-acrylic-based polymer films or photoresists, filled with a lead-free solder, and patterned on a dielectric material. Cleaning studies to remove the patterned photoresist film from the wafer coupons, which had been subjected to additional thermal treatment after solder deposition, were performed using a batch immersion process.

Coupon-sized samples of semiconductor wafers were processed in beakers. The beakers were filled with 100 mL of a stripping solution and heated using a hot plate to a temperature of 85° C. When the stripping solution was at 85° C., a coupon was placed in a holder in the beaker, and slight agitation was provided by a stir bar. Temperature was maintained at a temperature of 85° C. throughout the process. After a total processing time of 15-60 minutes, the coupons were removed from the beaker, rinsed with DI water and IPA, and dried with a stream of air.

For the experiments described below, compositions of all solutions tested are shown in Table 1. The components of each of the solutions in Table 1 total 100%. Any solutions not having components listed at a total 100% are due to rounding of the amounts of the components of the solution. Component amounts are based on initial amounts added and not on final QC of all components.

TABLE 1

Compositions for Examples 1-12

| Example | $H_2O$ | Amine | Sugar Alcohol | Base | Defoamer | Corrosion Inhibitor | Other |
|---|---|---|---|---|---|---|---|
| 1 | 91.8 g | 3 g DBU | N/A | 4.42 g TEAH | 0.18 g BYK-024 | 0.6 g Corfree M1 | N/A |
| 2 | 95.5 g | N/A | 2 g sorbitol | 2.5 g TMAH | N/A | | N/A |
| 3 | 93.9 g | 2.98 g DBU | N/A | 2.33 g TEAH | 0.18 g BYK-024 | 0.6 g Corfree M1 | N/A |
| 4 | 91.8 g | 3 g DBO | N/A | 4.42 g TEAH | 0.18 g BYK-024 | 0.6 g Corfree M1 | N/A |
| 5 | 89.8 g | 3 g DBU | 2 g sorbitol | 4.42 g TEAH | 0.18 g BYK-024 | 0.6 g Corfree M1 | |

TABLE 1-continued

Compositions for Examples 1-12

| Example | H$_2$O | Amine | Sugar Alcohol | Base | Defoamer | Corrosion Inhibitor | Other |
|---|---|---|---|---|---|---|---|
| 6 | 82 g | 15 g TEPA | N/A | 3 g TMAH | N/A | N/A | N/A |
| 7 | 84 g | 6 g MEA | N/A | 3 g TMAH | N/A | 1 g sorbitol | 6 g TEPA |
| 8 | 90.99 g | 2.98 g MEA | 1 g glycerin | 4.43 g TEAH | N/A | 0.6 g Corfree M1 | N/A |
| 9 | 92.26 g | 2.98 g MEA | 1 g glycerin | 3.16 g TMAH | N/A | 0.6 g Corfree M1 | N/A |
| 10 | 93.04 g | 2.98 g DBU | N/A | 3.2 g TMAH | 0.18 g BYK-024 | 0.6 g Corfree M1 | N/A |
| 11 | 91.82 g | 2.98 g MEA | N/A | 4.42 g TEAH | 0.18 g BYK-024 | 0.6 g Corfree M1 | N/A |
| 12 | 93.04 g | 2.98 g MEA | N/A | 3.2 g TMAH | 0.18 g BYK-024 | 0.6 g Corfree M1 | N/A |
| 13 | 90.36 g | 2.98 g MEA | 1 g glycerin | 5.06 g DMDPAH | N/A | 0.6 g Corfree M1 | N/A |
| 14 | 92.89 g | 2.98 g MEA | 1 g glycerin | 2.53 g ETMAH | N/A | 0.6 g Corfree M1 | N/A |
| 15 | 91.02 g | 2.98 g MEA | 1 g glycerin | 4.4 g TEAH | N/A | 0.6 g sebacic acid | N/A |
| 16 | 91.42 g | 2.98 g MEA | 1 g glycerin | 4.0 g TEAH | N/A | 0.6 g sebacic acid | N/A |
| 17 | 92.02 g | 2.98 g MEA | 1 g glycerin | 3.4 g TEAH | N/A | 0.6 g sebacic acid | N/A |
| 18 | 92.42 g | 2.98 g MEA | 1 g glycerin | 3.0 g TEAH | N/A | 0.6 g sebacic acid | N/A |
| 19 | 93.02 g | 2.98 g MEA | 1 g glycerin | 2.4 g TEAH | N/A | 0.6 g sebacic acid | N/A |

The follow abbreviations are used in the various formulations of solutions listed in Table 21:
DBU=1,8-Diazabicyclo[5.4.0]undec-7-ene
DBO=1,4 Diazabicyclo[2.2.2] octane
TEPA=tetraethylenepentamine
MEA=monoethanolamine
TMAH=tetramethylammonium hydroxide
TEAH=tetraethylammonium hydroxide
DMDPAH=dimethyldipropylammonium hydroxide
ETMAH=ethyltrimethylammonium hydroxide The compositions listed in Table 1 were used to remove negative patterned thick-acrylic-based polymer films or photoresists, filled with a lead-free solder, and patterned on a dielectric material. Resist removal was completed after solder fill and reflow. Resist removal and solder compatibility observations were recorded. The polymer film removal characteristics of each of the formulations in Table 2 were determined by removal of a photoresist which was an acrylic-based polymer film on a wafer coupon. Photoresist or polymer film removal is defined as "clean" if all polymer was removed from the wafer coupon surface; as "mostly clean" if at least 80% of the polymer was removed from the surface; "partly clean" if about 50% of the polymer was removed from the surface; and "not clean" if <50% of the polymer was removed from the surface. The results are shown in Table 2.

TABLE 2

Summary of resist removal results for Examples 37-48.

| Example | Process Temp (° C.) | Total Process Time (min) | Resist Removal | Solder Corrosion |
|---|---|---|---|---|
| 1 | 85 | 15 | Clean | Mild |
| 2 | 85 | 15 | Partly clean | Mild |
| 3 | 85 | 15 | Partly clean | Mild |
| 4 | 85 | 15 | Partly clean | Significant |
| 5 | 85 | 15 | Clean | Mild |
| 6 | 85 | 60 | Mostly Clean | Mild |
| 7 | 85 | 60 | Mostly Clean | Mild |
| 8 | 85 | 15 | Clean | Mild |
| 9 | 85 | 15 | Clean | Mild |
| 10 | 85 | 15 | Clean | Mild |
| 11 | 85 | 15 | Clean | Mild |
| 12 | 85 | 15 | Clean | Mild |
| 13 | 85 | 60 | Clean | Mild |
| 14 | 85 | 60 | Clean | Mild |
| 15 | 85 | 30 | Clean | Mild |
| 16 | 85 | 30 | Clean | Mild |
| 17 | 85 | 30 | Clean | Mild |
| 18 | 85 | 30 | Clean | Mild |
| 19 | 85 | 60 | Mostly clean | Mild |

The invention has been described in detail with particular reference to preferred embodiments thereof, but it will be understood that variations and modifications can be effected within the spirit and scope of the invention.

We claim:

1. A photoresist cleaning solution consisting of:
a tetra-alkyl substituted ammonium hydroxide selected from the group consisting of tetramethylammonium hydroxide, tetraethylammonium hydroxide, dimethyldipropylammonium hydroxide, ethyltrimethylammonium hydroxide and a combination of at least two thereof;

an amine selected from the group consisting of monoethanolamine, 1,8 diazabicyclo[5.4.0]undec-7-ene, tetraethylenepentamine, and a combination of at least two thereof;

at least one of a $C_4$-$C_{14}$ dibasic acid or an amine salt thereof; and water.

2. The solution of claim 1 wherein said $C_4$-$C_{14}$ dibasic acid is selected from the group consisting of dodecanedioic acid, sebacic acid, and undecanedioic acid.

3. The solution of claim 1 further consisting of a sugar alcohol.

4. The solution of claim 3 wherein said sugar alcohol is selected from the group consisting of glycerin, sorbitol, and xylitol.

5. A photoresist cleaning solution consisting of:

a tetra-alkyl substituted ammonium hydroxide selected from the group consisting of tetramethylammonium hydroxide, tetraethylammonium hydroxide, dimethyldipropylammonium hydroxide, ethyltrimethylammonium hydroxide, and a combination of at least two thereof in an amount of from about 1% by weight to about 8% by weight of a total weight of the solution;

an amine selected from the group consisting of monoethanolamine, tetraethylenepentamine, 1,8- diazabicyclo [5.4.0]undec-7-ene, and a combination of at least two thereof, in an amount of from about 0.8% by weight to about 10% by weight of the total weight of the solution;

at least one of a $C_4$-$C_{14}$ dibasic acid or an amine salt thereof in an amount of from about 0.1% by weight to about 9% by weight of the total weight of the solution;

a sugar alcohol in an amount of less than about 15% by weight of the total weight of the solution;

and the balance to 100 weight percent water.

6. The solution of claim 5 wherein said sugar alcohol is selected from the group consisting of glycerin, sorbitol, and xylitol.

7. The solution of claim 5 wherein said and $C_4$-$C_{14}$ dibasic acids are selected from the group consisting of dodecanedioic acid, sebacic acid, and undecanedioic acid.

8. A photoresist cleaning solution consisting of:

from about 3% by weight to about 5% by weight of a total weight of the solution of a tetra-alkyl substituted ammonium hydroxide selected from the group consisting of tetramethylammonium hydroxide, tetraethylammonium hydroxide, and a combination thereof;

from about 2% by weight to about 4% by weight of the total weight of the solution of an amine selected from the group consisting of monoethanolamine, tetraethylenepentamine, 1,8-diazabicyclo[5.4.0]undec-7-ene, and a combination of at least two;

from about 0.1% by weight to about 2% by weight of the total weight of the solution of a dibasic acid or an amine salt there of selected from the group consisting of dodecanedioic acid, sebacic acid, undecanedioic acid, and a mixture thereof; and the balance to 100 weight percent water.

9. The solution of claim 8 further consisting of about 1% by weight to about 3% by weight of the total solution of a sugar alcohol.

10. The solution of claim 9 wherein sugar alcohol is selected from the group consisting of glycerin, sorbitol, and xylitol.

11. The solution of claim 9 wherein sugar alcohol is glycerin.

12. A photoresist cleaning solution consisting of:

from about 1% by weight to about 5% by weight of a total weight of the solution of tetraethylammonium hydroxide;

from about 2% by weight to about 5% by weight of the total weight of the solution of monoethanolamine;

from about 0.1% by weight to about 2% by weight of the total weight of the solution of dodecanedioic acid, sebacic acid, or undecanedioic acid, a combination thereof or the amine salts thereof;

from about 0.1% by weight to about 2% by weight of the total weight of the solution of a sugar alcohol;

and the balance to 100 weight percent water.

13. The solution of claim 12 wherein said sugar alcohol is glycerin.

14. The solution of claim 12 wherein:

said tetraethylammonium hydroxide is present in an amount of from about 2% by weight to about 5% by weight of a total weight of the solution;

said monoethanolamine is present in an amount of from about 2% by weight to about 4% by weight of the total weight of the solution;

said sebacic acid or the amine salt thereof is present in an amount of from about 0.1% by weight to about 1% by weight of the total weight of the solution;

said sugar alcohol is glycerin present in an amount of from about 0.1% by weight to about 2% by weight of the total weight of the solution;

and the balance to 100 weight percent water.

* * * * *